(12) United States Patent
Patankar et al.

(10) Patent No.: US 8,768,668 B2
(45) Date of Patent: Jul. 1, 2014

(54) DIAGNOSTIC ALGORITHM PARAMETER OPTIMIZATION

(75) Inventors: Ravindra Patankar, Phoenix, AZ (US); Shreyas Iyer, Phoenix, AZ (US); Tim Felke, Glendale, AZ (US)

(73) Assignee: Honeywell International Inc., Morristown, NJ (US)

( * ) Notice: Subject to any disclaimer, the term of this patent is extended or adjusted under 35 U.S.C. 154(b) by 304 days.

(21) Appl. No.: 13/346,333

(22) Filed: Jan. 9, 2012

(65) Prior Publication Data

US 2013/0179129 A1 Jul. 11, 2013

(51) Int. Cl.
*G06G 7/48* (2006.01)
*G06F 17/50* (2006.01)
*G06F 11/26* (2006.01)
*G06F 11/32* (2006.01)
*G06F 11/36* (2006.01)
*G06F 11/07* (2006.01)
*G06F 11/22* (2006.01)
*G06F 17/10* (2006.01)

(52) U.S. Cl.
CPC .......... *G06F 17/5022* (2013.01); *G06F 11/261* (2013.01); *G06F 11/321* (2013.01); *G06F 11/366* (2013.01); *G06F 11/07* (2013.01); *G06F 11/0751* (2013.01); *G06F 11/0766* (2013.01); *G06F 11/079* (2013.01); *G06F 11/22* (2013.01); *G06F 17/10* (2013.01); *G06F 2207/7271* (2013.01)
USPC .............................................................. 703/6

(58) Field of Classification Search
CPC .............. G06F 17/5022; G06F 11/261; G06F 2207/7271; G06F 11/321; G06F 11/366; G06F 11/0703; G06F 3/121; G06F 11/07; G06F 11/0751; G06F 11/0766; G06F 11/079; G06F 11/22; G06F 11/1402; G06F 11/2252; G06F 17/10

USPC ........... 703/2, 6, 13; 714/26, 25; 702/184, 58; 706/2; 701/31.6, 213; 700/287; 342/357.58; 705/14.49
See application file for complete search history.

(56) References Cited

U.S. PATENT DOCUMENTS 6,405,108 B1 * 6/2002 Patel et al. ................... 701/31.6
7,017,079 B2 * 3/2006 Gulati et al. ..................... 714/25
(Continued)

FOREIGN PATENT DOCUMENTS

GB 2362481 A 11/2001
WO 2006123090 A2 11/2006
(Continued)

OTHER PUBLICATIONS

EP Search report dated May 3, 2013 for application No. EP 13 150 325.2.

(Continued)

*Primary Examiner* — Kandasamy Thangavelu
(74) *Attorney, Agent, or Firm* — Ingrassia Fisher & Lorenz, P.C.

(57) ABSTRACT

A system and method are provided for optimizing parameters of a plurality of selected diagnostic and/or prognostic algorithms in a tunable diagnostic algorithm library. A plurality of sensed data sets having an actual diagnostic label associated therewith is supplied to each of the diagnostic algorithms. A value for each parameter of each of the algorithms that are to be optimized is supplied. A computed diagnostic label is generated for each of the sensed data sets using each of the selected algorithms, a fault model, and the values for each parameter, each of the computed diagnostic labels and each of the actual diagnostic labels are supplied to a generic objective function, to thereby calculate an objective function value, and the value of one or more of the parameters is varied using an optimization routine that repeats certain of these steps until the objective function value is minimized.

19 Claims, 5 Drawing Sheets

(56) References Cited

U.S. PATENT DOCUMENTS

| | | | |
|---|---|---|---|
| 7,356,187 | B2 | 4/2008 | Shanahan et al. |
| 7,437,335 | B2 | 10/2008 | Baum |
| 7,941,009 | B2 | 5/2011 | Li et al. |
| 7,986,827 | B2 | 7/2011 | Rao et al. |
| 8,014,591 | B2 | 9/2011 | Baker |
| 2002/0072882 | A1* | 6/2002 | Kruger et al. ............... 703/2 |
| 2002/0169735 | A1 | 11/2002 | Kil et al. |
| 2004/0216004 | A1* | 10/2004 | Singh et al. ............... 714/25 |
| 2005/0096873 | A1* | 5/2005 | Klein ............... 702/184 |
| 2006/0074558 | A1* | 4/2006 | Williamson et al. ........ 701/213 |
| 2010/0100248 | A1* | 4/2010 | Minto et al. ............... 700/287 |
| 2010/0332475 | A1 | 12/2010 | Birdwell et al. |
| 2011/0258044 | A1* | 10/2011 | Kargupta ............... 705/14.49 |
| 2011/0307217 | A1* | 12/2011 | Fritz et al. ............... 702/183 |
| 2012/0146851 | A1* | 6/2012 | Fernandez ............... 342/357.58 |
| 2012/0185728 | A1* | 7/2012 | Guo et al. ............... 714/26 |
| 2012/0191384 | A1* | 7/2012 | Kalgren et al. ............... 702/58 |
| 2012/0317058 | A1* | 12/2012 | Abhulimen ............... 706/2 |

FOREIGN PATENT DOCUMENTS

| | | | |
|---|---|---|---|
| WO | 2010075408 | A1 | 7/2010 |
| WO | 2011109863 | A1 | 9/2011 |

OTHER PUBLICATIONS

EP Communication dated Jun. 12, 2013 for application No. EP 13 150 325.2.

Dumitras, T., Kavulya, S., Narasimhan, P.; A Fault Model for Upgrades in Distributed Systems; CMU-PDL-08-115, Dec. 2008; Parallel Data Laboratory, Carnegie Mellon University, Pittsburgh, PA.

Munson, A., Cardie, C., Caruana, R.; Optimizing to Arbitrary NLP Metrics Using Ensemble Selection; Department of Computer Science, Cornell University, Ithaca, NY, Oct. 2005.

Ganjisaffar, Y., Debeauvais, T., Javanmardi, S., Caruana, R., Lopes, C.V.; Distributed Tuning of Machine Learning Algorithms Using MapReduce Clusters, Aug. 2011.

Bartz-Beielstein, T.; SPOT: An R Package for Automatic and Interactive Tuning of Optimization Algorithms by Sequential Parameter Optimization; Department of Computer Science, Cologne University of Applied Sciences, 51643 Gummersbach, Germany, Jun. 25, 2010.

Orsila, H.; Optimizing Algorithms for Task Graph Mapping on Multiprocessor System on Chip; Thesis for the degree of Doctor of Science in Technology, Tampere University of Technology, Apr. 2011.

* cited by examiner

| COMPUTED ANNOTATIONS \ ACTUAL ANNOTATIONS | HEALTHY (H) | FAULT#1 (F1) | FAULT#2 (F2) |
|---|---|---|---|
| HEALTHY (H) | | | |
| FAULT#1 (F1) | | | |
| FAULT#2 (F2) | | | |
| FAULT#3 (F3) | | | |

FIG. 4

| COMPUTED ANNOTATIONS \ ACTUAL ANNOTATIONS (w) | HEALTHY (H) | FAULT#1 (F1) | FAULT#2 (F2) |
|---|---|---|---|
| HEALTHY (H) | -1 | 0.6 | 0.6 |
| FAULT#1 (F1) | 0.5 | -2 | 0 |
| FAULT#2 (F2) | 0.5 | 0 | -1 |
| FAULT#3 (F3) | 0.5 | 0 | 0 |

DIAGNOSTIC ALGORITHM PARAMETER OPTIMIZATION

TECHNICAL FIELD

The present invention generally relates to system diagnostic systems and methods, and more particularly relates to a process for optimizing the parameters of all of the deployed diagnostic algorithms from a library of tunable diagnostic algorithms to thereby provide improved better diagnostics.

BACKGROUND

Modern electronic and mechanical systems, such as aircraft or other vehicles, are becoming increasingly complex. Health management systems are often used to monitor various health states of vehicle systems. Several factors contribute to the evolution of the health states. These factors include damage accumulation, interaction between components in the system, deviation from design characteristics, and the influence of continuous or discrete events. These aspects can be modeled and evaluated using prognostic and diagnostic indictors in an effort to predict faults in the vehicle system. However, the complexities of modern electronic and mechanical systems have led to increasing needs for more sophisticated health systems. Information about potential faults enables such faults to be addressed before issues arise. In general, this information may provide support for an operator or other individual for use in making decisions regarding future maintenance, operation, or use of the system, and/or for use in making other decisions.

Some health management systems that have been developed are configurable, in the sense that these health management systems can be deployed across various applications. Such health management systems typically rely on a library of algorithms. Each of the algorithms within the library includes one or more associated parameters that may need to be customized for the application in which it is deployed. Some of these parameters, such as pipe diameter, are readily obtainable from asset/system specifications or measurements. However, various other parameters, such as all data driven parameters or certain model parameters, may not be readily available, but need to be selected prior to system/asset deployment. These latter parameters may be selected by specialized personnel, such as an algorithm expert, based on their knowledge of the particular asset/system and a review of associated asset/system historic data. As may be appreciated, this latter parameter selection process may involve trial and error, can be relatively time consuming, is potentially prone to suboptimal selection of parameters, and relies on specialized personnel for parameter selection. Optimization of parameters generally relies on an optimization expert to formulate an appropriate objective function for a specific optimization problem. This invention makes parameter optimization for diagnostic/prognostic problem usable to non-experts by defining a generic objective function for all detection problems of this sort.

Hence, there is a need for process of selecting parameters for diagnostic algorithms within a library of diagnostic algorithms that does not rely on specialized personnel, and thus does not involve human-effected trial and error, and/or is relatively less time consuming than current methods, and/or is less prone to suboptimal selection. The present invention addresses at least these needs.

BRIEF SUMMARY

In one embodiment, a method for optimizing parameters of a plurality of selected diagnostic and/or prognostic algorithms in a tunable diagnostic algorithm library includes supplying a plurality of sensed data sets to each of the diagnostic algorithms, where each of the sensed data sets having an actual diagnostic label associated therewith. A value for each parameter of each of the diagnostic algorithms that are to be optimized is supplied. A computed diagnostic label is generated for each of the sensed data sets using each of the selected algorithms, a fault model, and the values for each parameter, each of the computed diagnostic labels and each of the actual diagnostic labels are supplied to a generic objective function, to thereby calculate an objective function value, and the value of one or more of the parameters is varied using an optimization routine that repeats certain of these steps until the objective function value is minimized.

In another embodiment, a method for optimizing parameters of one or more diagnostic algorithms that are configured to supply one or more computed fault labels includes supplying a plurality of sensed data sets to each of the one or more diagnostic algorithms, where each of the sensed data sets having an actual fault label associated therewith. A value for each parameter of each of the one or more diagnostic algorithms that is to be optimized is supplied. All possible computed labels that each of the one or more diagnostic algorithms can generate are determined. A confusion matrix having a plurality of entries and that includes a separate row for each of the possible computed fault labels and a separate column for each actual fault label is generated. A relative weight value is assigned to each entry in the confusion matrix to thereby generate a weighting matrix (W). A computed fault label is generated for each of the sensed data sets using each of the one or more diagnostic algorithms and the initial values for each parameter, where each computed fault label comprises a probability vector. Each of the computed fault labels, each of the actual fault labels, and the weighting matrix are supplied to a generic objective function, to thereby calculate an objective function value. The value of one or more of the parameters is varied using an optimization routine that repeats certain of these steps until the objective function value is minimized.

In yet another embodiment, a system for optimizing parameters of a plurality of diagnostic algorithms in a tunable diagnostic algorithm library includes a processor that is configured to implement each of the diagnostic algorithms and a fault model, and to receive a plurality of sensed data sets, each having an actual diagnostic label associated therewith, and a value for each parameter of each of the diagnostic algorithms that are to be optimized. The processor is further configured to generate a computed diagnostic label for each of the sensed data sets using each of the diagnostic algorithms and the initial values for each parameter, supply each of the computed diagnostic labels and each of the actual diagnostic labels to a generic objective function, to thereby calculate an objective function value; and selectively vary the value of one or more of the parameters using an optimization routine that repeats various process steps until the objective function value is minimized.

Furthermore, other desirable features and characteristics of the system and method described herein will become apparent from the subsequent detailed description and the appended claims, taken in conjunction with the accompanying drawings and the preceding background.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

Figure 1:
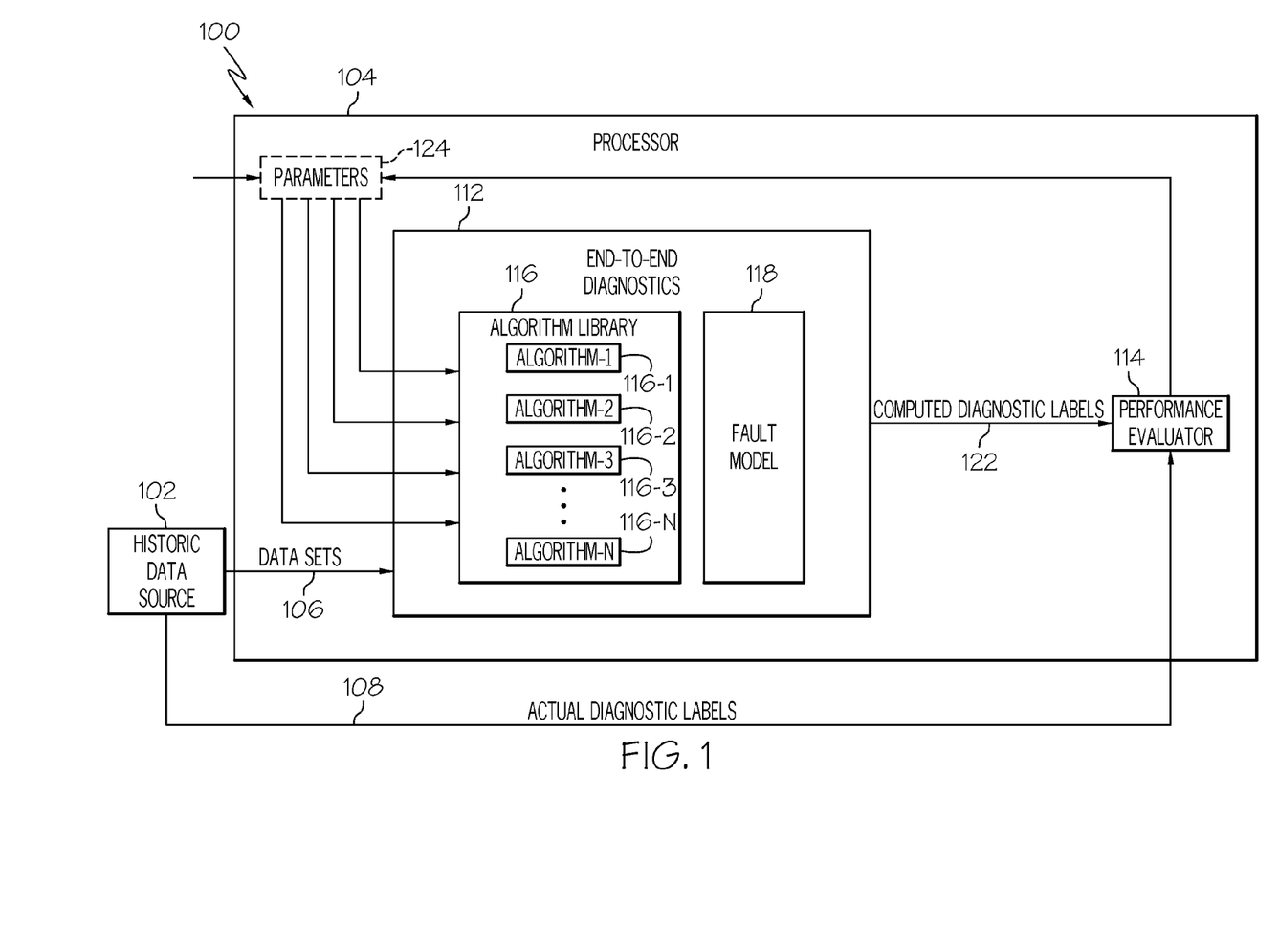
FIG. 1 depicts a functional block diagram of an embodiment of a system that may be used to implement a process to optimize the parameters of a plurality of diagnostic algorithms in a tunable diagnostic algorithm library.

Referring first to FIG. 1, a functional block diagram of a system 100 for implementing a process to optimize the parameters of a plurality of diagnostic algorithms in a tunable diagnostic algorithm library. The depicted system 100 includes an historic data source 102 and one or more configurable processors 104. The historic data source 102 has labeled historic data stored therein. The labeled historic data comprise, more specifically, a plurality of sensed data sets 106 that, as will be explained further below, each have an associated actual diagnostic label 108.

It will be appreciated that the historic data source 102 may be variously configured and implemented. For example, the historic data source 102 may be implemented using any suitable data storage device. Moreover, the labeled historic data may be stored in the historic data source 102 in accordance with any one of numerous data storage schema.

The processor 104, while depicted for clarity and ease of illustration and description as being implemented as a single processor 104, may be implemented using a plurality of suitable processors 104, if needed or desired. The processor 104 is coupled to the historic data source 104, and is configured to selectively retrieve sensor data sets 106 and the associated actual diagnostic labels 108 therefrom. As FIG. 1 also depicts, the processor 104 is additionally configured to implement end-to-end diagnostics 112 and a performance evaluator 114. The end-to-end diagnostics 112, implementing a tunable algorithm library 116 and a fault model 118, generates computed diagnostic labels 122, and supplies these computed diagnostic labels 122 to the performance evaluator 114.

The tunable algorithm library 116 comprises a plurality of diagnostic algorithms 116-1, 116-2, 116-3, 116-N. Each of the diagnostic algorithms in the library 116 has one or more parameters 124 associated therewith that need to be customized for the application in which the end-to-end diagnostics 112 is to be deployed. Before proceeding further, it should be noted that the sensor data sets 106 and the associated actual diagnostic labels 108 that are supplied from the historic data source 102 to the processor 104 are associated with the same application in which the end-to-end diagnostics 112 is to be deployed. Thus, if the end-to-end diagnostics 112 is to be deployed for a particular type of engine, the sensor data sets 106 and the associated actual diagnostic labels 108 will be from this particular type of engine.

The performance evaluator 114 receives the computed diagnostic labels 122 and the actual diagnostic labels 108 and is configured, in response thereto, to evaluate the performance of the end-to-end diagnostics 112 and, based on the evaluated performance, to selectively vary one or more of the parameters 124. As will be described in more detail further below, the performance evaluator 114 implements this functionality by computing a performance score using a generic objective function. As will also be described in more detail further below, the processor 104 iteratively implements the end-to-end diagnostics 112 and the performance evaluator 114, using the retrieved sensor data sets 106 and associated actual diagnostic labels 108, until the computed performance score is minimized. When the computed performance score is minimized, this indicates the parameters 124 associated with the diagnostic algorithms 116 have been optimized (or "tuned") for the end-use application.

A more detailed description of the generalized process that was described above and that is at least partially implemented in the processor 104 will be described in more detail momentarily. Before doing so, however, a brief overview of the functionality implemented by the diagnostic algorithms 116 and the fault model 118 will be provided. In doing so, reference should be made to FIG. 2, which depicts a functional block diagram of a portion of the diagnostic algorithm library 116 and the fault model 118. It should be noted that, for ease of description, the depicted diagnostic algorithm library 116 includes only three algorithms 116-1, 116-2, 116-3. It should additionally be noted that m1, m2, and m3 are measurements from the selected data sets while p1 thru p5 and th1 thru th5 are algorithm parameters.

Figure 2:
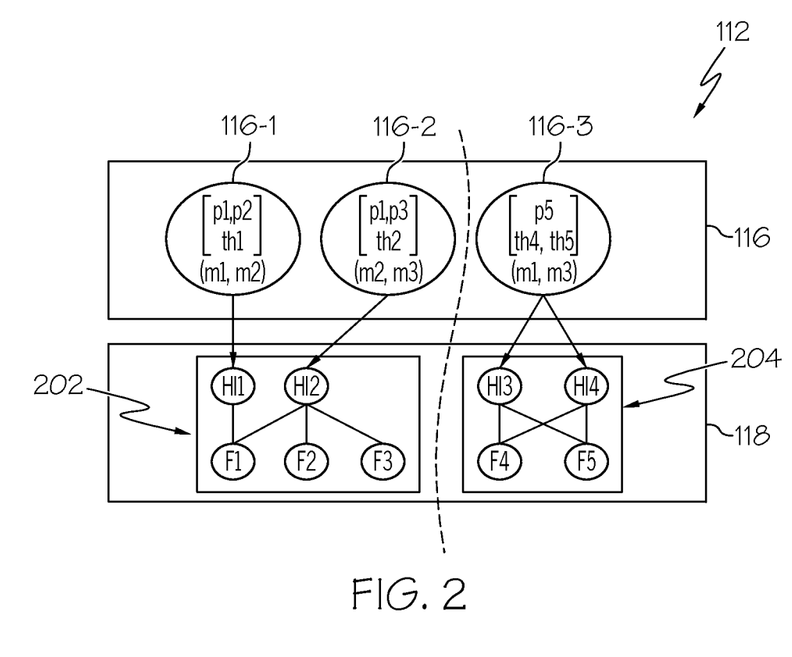
FIG. 2 depicts a functional block diagram of a portion of an exemplary diagnostic algorithm library and a fault model.

The diagnostic algorithms 116 are each configured to compute a health indicator (HI). The computed HIs are binary, and represent a true (or healthy) state or a false (or unhealthy) state. The computed HIs are supplied to the fault model 118, which maps the HIs to computed fault labels F1, F2, F3, . . . FN. More specifically, given a set of HIs, the fault model 118 computes a list of fault labels and associated probabilities (or ranking) as the current diagnostic estimate of the system.

Figure 3:
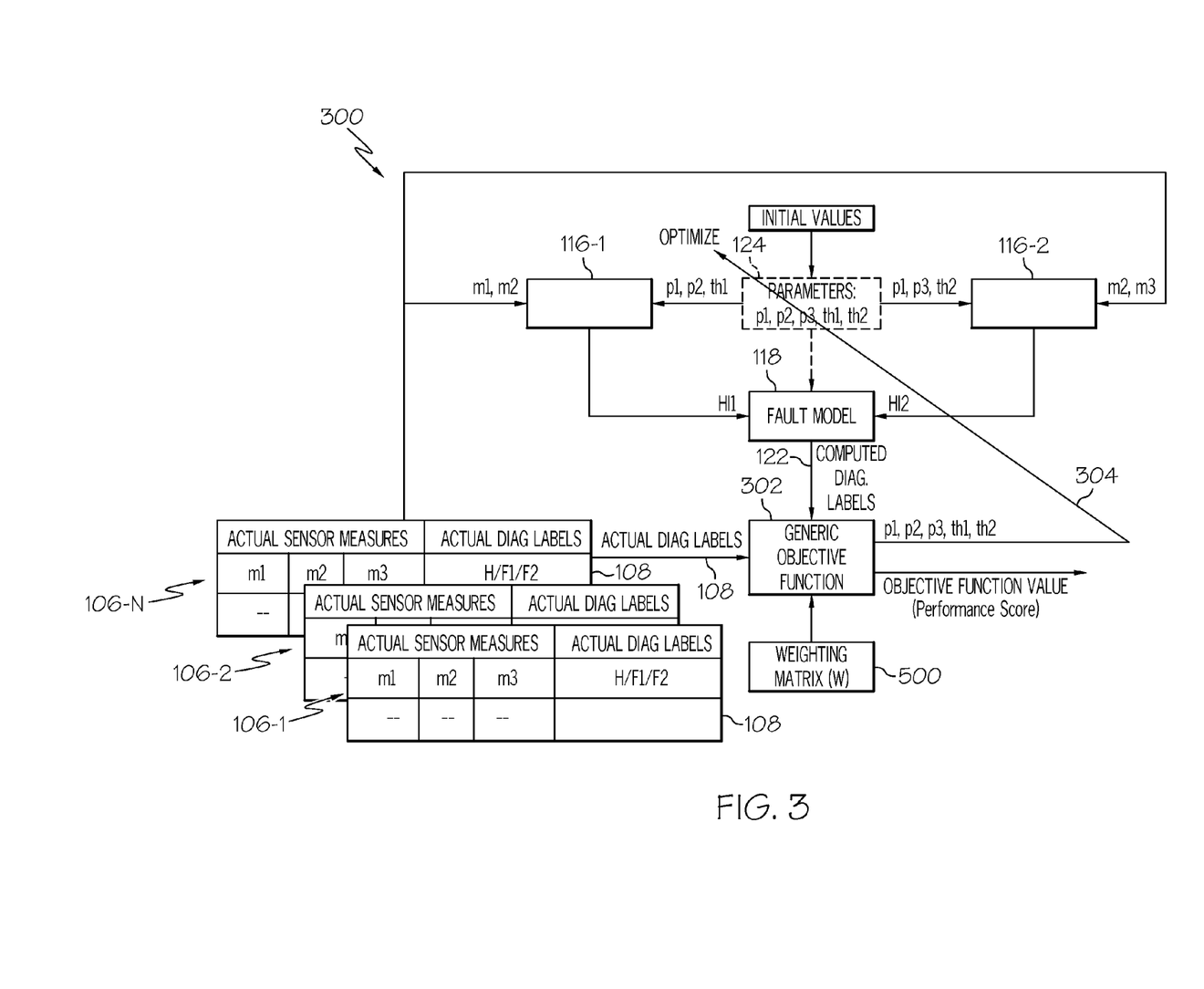
FIG. 3 depicts a simplified representation of a parameter optimization process that may be implemented in the system of FIG. 1.

Referring now to FIG. 3, the parameter optimization process 300 is depicted and will now be described. The depicted process 300 includes various pre-processing steps that may be carried out by a user prior to any automated processing that is implemented in the processor 104. The pre-processing steps include selecting the sensed data sets for which the performance of the diagnostic algorithms 116 will be evaluated and tuned, selecting one or more diagnostic algorithms from the diagnostic algorithm library 116, generating a weighting matrix, and supplying initial values for each parameter 124 of the selected diagnostic algorithms 116. Each of these pre-processing steps will now be described.

The sensed data sets 106 (e.g., 106-1, 106-2, 106-3, . . . 106-N) each comprise actual sensor measurement(s) (e.g., m1, m2, m3, . . . mN) that the algorithms 116 use to compute an HI. Each of the sensed data sets 106 also includes an actual diagnostic label 108. As indicated in FIG. 3, the diagnostic label may be a healthy label ("H") or any one of numerous actual fault labels (e.g., "F1" or "F2" . . . or FN). The healthy label ("H") means that the sensed data set is indicative of a healthy system, whereas a fault label means that the sensed data set is indicative of a particular system fault. Thus, a user reviews all of the data sets 106 and determines which ones have actual fault labels, and what those fault labels are. The user then determines which of the algorithms in the algorithm library 116 can compute HIs that the fault model 118 will map to these same, albeit computed, fault labels. It should be noted that the healthy label is, by definition, not an actual fault label. Hence, healthy labels are not considered for this step even though the healthy label data is needed for the optimization step.

In order to select one or more diagnostic algorithms from the diagnostic algorithm library 116 to be evaluated and tuned, it should be readily understood from FIG. 2 and the associated description above that the set of possible computed fault labels (F1, F2, F3, . . . FN) that the fault model 118 maps from each of the HIs that are computed by each diagnostic algorithm in the diagnostic algorithm library 116 are known ahead of time. Based on the fault model mapping that is implemented in the fault model 118, a user may thus divide the HIs and the fault labels to which the HIs are mapped into the smallest possible self-contained independent groups, and then select the associated diagnostic algorithms 116. In order to provide an example of this algorithm selection technique, reference should be made to the simplified embodiment depicted in FIG. 2. In this simplified embodiment, it is seen that computed fault label F1 may be mapped from two different HIs—HI1 and HI2; computed fault labels F2 and F3 may each be mapped from a single HI—HI2; and computed fault labels F4 and F5 may each be mapped from a two different HIs—HI3 and HI4. Thus, the depicted HIs and fault labels may be divided into two self-contained independent groups—a first group 202 and a second group 204. It should be noted that the tunable parameters selected for the two groups, viz., (p1, p2, p3, th1, th2) and (p5, th4, th5) do not overlap. The HIs in the first group 202 (HI1, HI2) may be computed from two diagnostic algorithms 116-1 and 116-2, and the HIs in the second group 204 (HI3, HI4) may be computed from a single diagnostic algorithm 116-3. Although this process, which is referred to herein as "divide and conquer," is optional, it should be noted that the problem division will typically make the subsequent optimization much more efficient.

In order to generate the weighting matrix (W), the processor 104, based on the fault model, determines all of the possible computed diagnostic labels that the set of the user selected diagnostic algorithms 116 can generate. The processor 104 adds the healthy label (H) to this set of computed diagnostic labels to generate what are referenced in FIGS. 4 and 5 as "Computed Annotations." Thus, continuing with the example depicted in FIG. 2, if the algorithms 116-1, 116-2 associated with the first group 202 are selected, then all of the possible computed diagnostic labels that can be generated include F1, F2, and F3. Similarly, if the algorithm 116-3 associated with the second group 204 is selected, then all of the possible computed diagnostic labels that can be generated include F4 and F5. If it is assumed that the first group 202 is selected, then the Computed Annotations include H, F1, F2, and F3. The user then reviews the selected data sets 106 and removes any that include an actual diagnostic label 108 that differs from any of the Computed Annotations. The actual diagnostic labels 108 associated with the selected data sets 106 are referenced in FIGS. 4 and 5 as "Actual Annotations."

Figure 4:
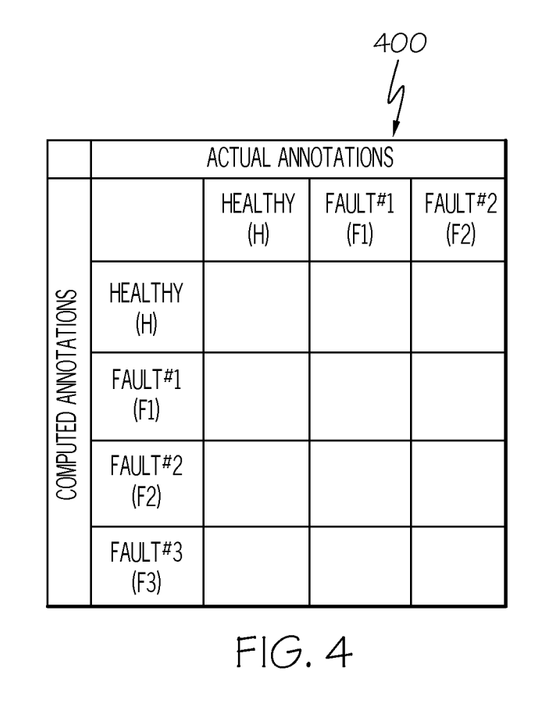
FIGS. 4 and 5 depict examples of a confusion matrix and a weighting matrix, respectively.

The Computed Annotations and the Actual Annotations are then used to generate what is referred to herein as a confusion matrix. The confusion matrix 400, which is depicted in FIG. 4, has a plurality of entries, and includes a separate row for each of the Computed Annotations (e.g., possible computed diagnostic labels) and a separate column for each of the Actual Annotations (e.g., actual diagnostic labels). It will be appreciated that the number of columns in the confusion matrix 400 will be, at most, the same as the number of rows. It could, however, have less number of columns than rows. This may occur when, for example, the selected data sets 106 do not include one or more diagnostic labels 108 that match the Computed Annotations. This is the case in the depicted confusion matrix 400, which is a 4×3 matrix, where the selected data sets 106 did not include an actual diagnostic label of F3.

Figure 5:
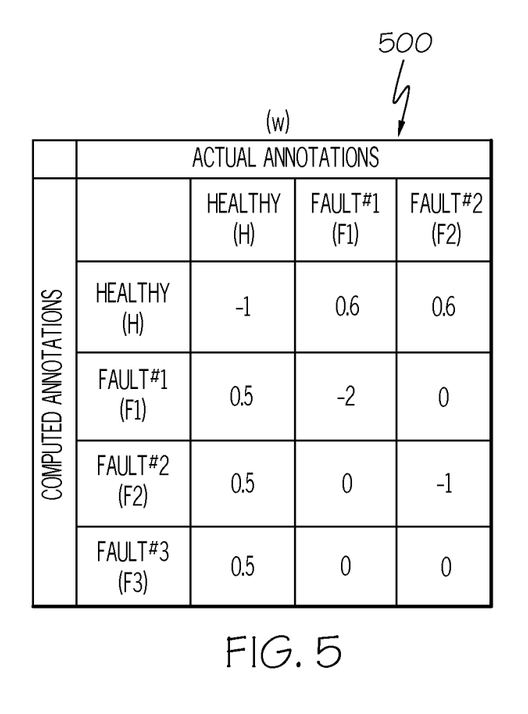

After the rows and the columns of the confusion matrix 400 are defined, the user may then supply the weighting matrix (W) by assigning a weight value to each entry in the confusion matrix 400. FIG. 5 depicts an exemplary embodiment of a weighting matrix (W) 500 that has the same dimensions as the confusion matrix 400 depicted in FIG. 4. The weight values that are assigned to each entry are based on user (or other expert personnel) experience, and on the corresponding behavior in the confusion matrix 400 that the user wants to encourage or discourage during parameter optimization. Typically, one would want to encourage correct detection and perhaps penalize incorrect detection. As may be appreciated, the user will always want to encourage the diagonal elements. This is because diagonal elements connote a match between a computed diagnostic label and an actual diagnostic label, whereas off-diagonal elements connote a mismatch, which implies a false, missed, or otherwise incorrect fault detection. Thus, the diagonal elements in the weighting matrix (W) may typically have magnitudes that are relatively larger than the off-diagonal elements. However, as the exemplary weighting matrix (W) 500 depicts, diagonal elements need not have the same magnitudes. Although these behaviors are encouraged relative to those represented by non-diagonal elements, the user may, for various reasons, need or want to encourage some diagonal element behaviors more than others.

In addition to the differing magnitudes, it is also seen that the behaviors the user wants to encourage are given negative values, and the behaviors that the user wants to discourage are given positive values. This is because of the manner in which the previously-mentioned generic objective function is implemented in the performance evaluator 114.

For each of the selected algorithms 116, the user determines the specific parameters 124 to tune, and supplies an initial value for each of these parameters 124. The user may also provide an upper and a lower bound for each of these parameters 124, and the processor 104 normalizes each parameter 124 using the associated bounds. Referring once again to FIG. 2, and assuming that the algorithms 116-1, 116-2 in the first group 202 are selected, it may be readily seen that the parameters 124 to be optimized (or tuned) include p1, p2, p3, th1, and th2. It will be appreciated that these specific labels (e.g., p1, p2, p3, th1, th2), as well as the number of labels, are merely used for illustrative purposes. In other embodiments, and indeed with other diagnostic algorithms 116, the particular parameters, numbers of parameters, and the labels that may be used to represent these parameters, may all vary.

Figure 6:
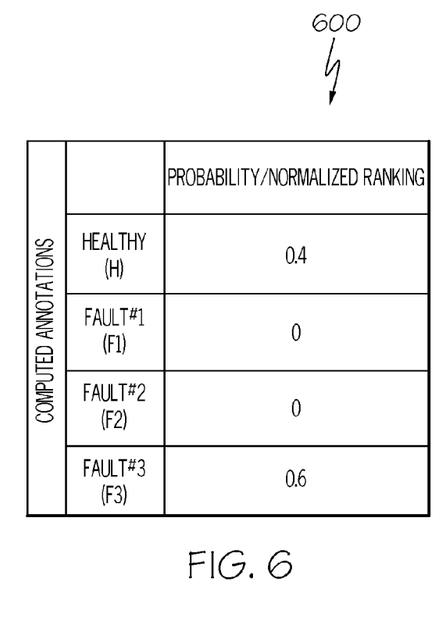
FIG. 6 depicts an example of a potential computed diagnostic label.

After the pre-processing steps are completed, the selected data sets 106, the weighting matrix 500, and the initial values of the parameters 124 may be supplied to the processor 104 for the automated processing portion of the overall process. The automated processing uses the values of the parameters 124 to execute the user selected diagnostic algorithms 116 for each of the selected data sets 106, and thereby computes HIs for each data set 106. Again, assuming that the diagnostic algorithms 116-1, 116-2 in the second group 202 were selected, it may be readily appreciated, upon viewing FIGS. 2 and 3, that diagnostic algorithm 116-1 computes HI1 using actual sensor measurements m1 and m2, and parameters p1, p2, and th1. Similarly, diagnostic algorithm 116-2 computes HI2 using actual sensor measurements m2 and m3, and parameters p1, p3, and th2. The computed HIs are passed to the fault model 118, which maps the HIs to computed diagnostic labels. As noted previously, the fault model 118 generates the computed diagnostic labels in terms of a probability (normalized ranking) vector corresponding to the computed annotations. An example of a potential computed diagnostic label 600 is depicted in FIG. 6.

The computed diagnostic labels 600, the actual labels 108, and the weighting matrix (W) 500 are all supplied to the previously mentioned generic objective function 302, which, as was also previously mentioned, may be implemented in the performance evaluator 114. The generic objective function 302 computes an objective function value. In order to do so, the generic objective function 302 first computes a normalized score $S_{a(k)}$ for each of the Actual Annotations. More specifically, for each actual diagnostic label a(k) in the Actual Annotations, the generic objective function 302 determines which data sets x(m) of the selected data sets 106 have this label. As an example, assume that out of all of the selected data sets 106, there are a total of j data sets that have a particular actual diagnostic label a(k), and that for each of these j data sets the fault model 118 generates a computed diagnostic label in terms of probability vector $P_{x(m)}$. For each of these data sets x(m), a normalized score $S_{a(k)}$ for the actual annotation a(k) is computed, as indicated in the following equation, by summing up the computed probability vectors $P_{x(m)}$ and dividing by the number of data sets (e.g., j) that have the particular actual diagnostic label a(k):

$$S_{a(k)} = \frac{\sum_{m=1}^{j} P_{x(m)}}{j}.$$

As may be appreciated, each normalized score $S_{a(k)}$ is a column vector that corresponds to a particular Actual Annotation a(k) and the set of Computed Annotations, and the sum of this vector is 1. After all of the normalized scores $S_{a(k)}$ are computed, they are arranged into a score matrix or normalized confusion matrix (S) that exactly matches the dimensions of the weighting matrix (W) 500. The score matrix (S) is a probability matrix and clearly shows that for each actual diagnostic label a(k) in the selected data sets 106, and for the current values of the parameters 124, what the probabilities are that the end-to-end diagnostics 112 will generate computed diagnostic labels in the Computed Annotations. The generic objective function computes the objective function value (OFV) by taking the row and column sum of the element-wise multiplication of the weighting matrix (W) and the score matrix (S), as shown in the equation below:

$$OFV = \sum_{i=1}^{p} \sum_{l=1}^{q} S_{il} W_{il},$$

where, as noted from the data set selection process, q≤p.

In alternative embodiments, it may be desired to ensure that the absolute minimum value of the objective function value will always be zero. For such alternative embodiments, the following equation is used to calculate the objective function value:

$$OFV = \sum_{i=1}^{p} \sum_{l=1}^{q} S_{il} W_{il} - \sum_{l=1}^{q} W_{ll}.$$

The automated processing also implements an optimization routine 304 to vary the value of one or more of the parameters 124, to thereby minimize the objective function value. It will be appreciated that any one of numerous known optimization routines, such as grid search, interior point methods, genetic optimization, etc. may be used.

The system and method disclosed herein for selecting parameters 124 for diagnostic algorithms within a library of diagnostic algorithms 116 does not rely solely on specialized personnel, and thus does not involve human-effected trial and error. The system and method are relatively less time consuming than current methods, and are less prone to suboptimal selection. Although the process 300 was described in the context of only two diagnostic algorithms (e.g., 116-1, 116-2) and associated parameters 124 and data, it should be appreciated that this was done merely for ease of depiction and explanation. The process 300 may be extended to simultaneously optimize the parameters 124 of any number of diagnostic algorithms 116.

Those of skill in the art will appreciate that the various illustrative logical blocks, modules, circuits, and algorithm steps described in connection with the embodiments disclosed herein may be implemented as electronic hardware, computer software, or combinations of both. Some of the embodiments and implementations are described above in terms of functional and/or logical block components (or modules) and various processing steps. However, it should be appreciated that such block components (or modules) may be realized by any number of hardware, software, and/or firmware components configured to perform the specified functions. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for optimizing parameters of a plurality of selected diagnostic algorithms in a tunable diagnostic algorithm library, the method comprising the steps of:
    a) supplying a plurality of sensed data sets to each of the selected algorithms implemented in a processor, each of the sensed data sets having an actual diagnostic label associated therewith;
    b) supplying, to the processor, a value for each parameter of each of the selected algorithms that is to be optimized; and
    in the processor:
        c) generating a computed diagnostic label for each of the sensed data sets using each of the selected algorithms, a fault model, and the value for each parameter;
        d) supplying each of the computed diagnostic labels and each of the actual diagnostic labels to a generic objective function, to thereby calculate an objective function value; and
        e) varying the value of one or more of the parameters using an optimization routine that repeats steps c)-e) until the objective function value is minimized.

2. The method of claim 1, further comprising:
    determining, in the processor and based on the fault model, all possible computed diagnostic labels that the selected algorithms will generate;
    defining rows and columns of a confusion matrix having a plurality of entries and that includes a separate row for each of the possible computed diagnostic labels and a separate column for each actual diagnostic label; and
    assigning a weight value to each entry in the confusion matrix to thereby generate a weighting matrix (W).

3. The method of claim 2, wherein each computed diagnostic label comprises a probability vector corresponding to each of the possible computed diagnostic labels.

4. The method of claim 3, further comprising generating a normalized confusion matrix (S) based on each of the actual diagnostic labels and using each of the probability vectors.

5. The method of claim 4, wherein the step of generating a normalized confusion matrix comprises calculating a normalized probability vector of each computed diagnostic label for each of the actual diagnostic labels.

6. The method of claim 4, wherein:
    the weighting matrix (W) and the normalized confusion matrix (S) are each p×q matrices; and
    the objective function value is calculated using:

$$\text{objective function value} = \sum_{i=1}^{p} \sum_{l=1}^{q} S_{il} W_{il}.$$

7. The method of claim 4, wherein:
    the weighting matrix (W) and the normalized confusion matrix (S) are each p×q matrices; and
    the objective function value is calculated using:

$$\text{objective function value} = \sum_{i=1}^{p} \sum_{l=1}^{q} S_{il} W_{il} - \sum_{l=1}^{q} W_{ll}.$$

8. A method for optimizing parameters of one or more diagnostic algorithms that are configured to supply one or more computed fault diagnostic labels, comprising the steps of:
    a) supplying a plurality of sensed data sets to each of the one or more diagnostic algorithms implemented in a processor, each of the sensed data sets having an actual diagnostic label associated therewith;
    b) supplying, to the processor, a value for each parameter of each of the one or more diagnostic algorithms that is to be optimized;
    c) determining, in the processor and based on a fault model, all possible computed diagnostic labels that each of the one or more diagnostic algorithms will generate;
    d) generating, in the processor, a confusion matrix having a plurality of entries and that includes a separate row for each of the possible computed diagnostic labels and a separate column for each actual diagnostic label;

e) assigning, in the processor, a relative weight value to each entry in the confusion matrix to thereby generate a weighting matrix (W); and in the processor:

f) generating a computed diagnostic label for each of the sensed data sets using each of the one or more diagnostic algorithms and the value for each parameter, each computed diagnostic label comprising a probability vector;

g) supplying each of the computed diagnostic labels, each of the actual diagnostic labels, and the weighting matrix to a generic objective function, to thereby calculate an objective function value; and     h) varying the value of one or more of the parameters using an optimization routine that repeats steps f)-h) until the objective function value is minimized.

9. The method of claim 8, further comprising:
generating a normalized confusion matrix (S) based on each of the actual diagnostic labels and using each of the probability vectors.

10. The method of claim 9, wherein the step of generating a normalized confusion matrix comprises calculating a normalized score for each of the actual diagnostic labels.

11. The method of claim 10, wherein:
the weighting matrix (W) and the normalized confusion matrix (S) are each p×q matrices; and
the objective function value is calculated using:

$$\text{objective function value} = \sum_{i=1}^{p} \sum_{l=1}^{q} S_{il} W_{il}.$$

12. The method of claim 10, wherein:
the weighting matrix (W) and the normalized confusion matrix (S) are each p×q matrices; and
the objective function value is calculated using:

$$\text{objective function value} = \sum_{i=1}^{p} \sum_{l=1}^{q} S_{il} W_{il} - \sum_{l=1}^{q} W_{ll}.$$

13. A system for optimizing parameters of a plurality of diagnostic algorithms in a tunable diagnostic algorithm library, the system comprising:

a processor configured to implement each of the diagnostic algorithms and a fault model, and to receive (i) a plurality of sensed data sets, each having an actual diagnostic label associated therewith, and (ii) a value for each parameter of each of the diagnostic algorithms that is to be optimized, the processor further configured to:

a) generate a computed diagnostic label for each of the sensed data sets using each of the diagnostic algorithms and the value for each parameter;

b) supply each of the computed diagnostic labels and each of the actual diagnostic labels to a generic objective function, to thereby calculate an objective function value; and c) selectively vary the value of one or more of the parameters using an optimization routine that repeats steps a)-c) until the objective function value is minimized.

14. The system of claim 13, wherein:
the processor is further configured to receive a weighting matrix (W); and
the weighting matrix is generated by:
    determining, in the processor and based on the fault model, all possible computed diagnostic labels that each of the diagnostic algorithms will generate,
    generating a confusion matrix having a plurality of entries and that includes a separate row for each of the possible computed diagnostic labels and a separate column for each actual diagnostic label, and
    assigning a weight value to each entry in the confusion matrix.

15. The system of claim 14, wherein each computed diagnostic label comprises a probability vector corresponding to each possible computed diagnostic label.

16. The system of claim 15, wherein the processor is further configured to generate a normalized confusion matrix (S) based on each of the actual diagnostic labels and using each of the probability vectors.

17. The system of claim 16, wherein the processor is further configured to calculate a normalized score for each of the actual diagnostic labels.

18. The system of claim 16, wherein:
the weighting matrix (W) and the normalized confusion matrix (S) are each p×q matrices; and
the processor is configured to calculate the objective function value using:

$$\text{objective function value} = \sum_{i=1}^{p} \sum_{l=1}^{q} S_{il} W_{il}.$$

19. The system of claim 16, wherein:
the weighting matrix (W) and the normalized confusion matrix (S) are each p×q matrices; and
the processor is configured to calculate the objective function value using:

$$\text{objective function value} = \sum_{i=1}^{p} \sum_{l=1}^{q} S_{il} W_{il} - \sum_{l=1}^{q} W_{ll}.$$

* * * * *